US011469768B2

(12) United States Patent
Kushnir et al.

(10) Patent No.: US 11,469,768 B2
(45) Date of Patent: Oct. 11, 2022

(54) SYSTEMS, METHODS, AND DEVICES FOR DIGITAL-TO-ANALOG CONVERSION IN DATA TRANSMISSION

(71) Applicant: MELLANOX TECHNOLOGIES, LTD., Yokneam (IL)

(72) Inventors: Igal Kushnir, Hod-Hasharon (IL); Eshel Gordon, Aloney Aba (IL); Roi Levi, Kiryat Tivon (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 17/188,696

(22) Filed: Mar. 1, 2021

(65) Prior Publication Data

US 2022/0278693 A1 Sep. 1, 2022

(51) Int. Cl.
*H03M 1/66* (2006.01)
*H04B 1/04* (2006.01)

(52) U.S. Cl.
CPC ............... *H03M 1/66* (2013.01); *H04B 1/04* (2013.01)

(58) Field of Classification Search
CPC ............ H03M 3/502; H03M 1/66; H04B 1/40
See application file for complete search history.

(56) References Cited

U.S. PATENT DOCUMENTS

| 7,830,217 | B1 * | 11/2010 | Stein | ...................... H04L 27/365 |
| | | | | 332/144 |
| 10,833,699 | B1 * | 11/2020 | Maheswaran | ............ H03M 3/50 |
| 2008/0143572 | A1 * | 6/2008 | Magrath | ............. H03M 1/0665 |
| | | | | 341/144 |
| 2021/0100014 | A1 * | 4/2021 | Kong | ................ H04W 72/1257 |

* cited by examiner

*Primary Examiner* — David S Huang
(74) *Attorney, Agent, or Firm* — Sheridan Ross P.C.

(57) ABSTRACT

A digital to analog converter (DAC) includes a first amplifier configured to receive a first bit of a data block as an input and output a first signal based on a value of the first bit of the data block, a first filter circuit configured to filter the first signal, an output configured to output an analog signal based on a combination of the filtered first signal and a second signal that represents a value of a second bit of the data block.

20 Claims, 4 Drawing Sheets

SYSTEMS, METHODS, AND DEVICES FOR DIGITAL-TO-ANALOG CONVERSION IN DATA TRANSMISSION

FIELD OF THE DISCLOSURE

The present disclosure is generally directed to systems, methods, and devices for digital-to-analog conversion in data transmission.

BACKGROUND

Data transmission devices may include digital-to-analog converters (DACs) to assist with converting digital data into analog data for transmission over a network. The type of DAC used in a data transmission device is one factor that impacts performance (e.g., transmission rate capabilities, reliability of transmitted data, etc.) of the data transmission device.

BRIEF SUMMARY

In an illustrative embodiment, a digital to analog converter (DAC) includes a first amplifier configured to receive a first bit of a data block as an input and output a first signal based on a value of the first bit of the data block, a first filter circuit configured to filter the first signal, an output configured to output an analog signal based on a combination of the filtered first signal and a second signal that represents a value of a second bit of the data block.

In an illustrative embodiment, a transmitter includes a parallel input serial output (PISO) device configured to output digital serialized data based on digital parallel input data, and a DAC. The DAC includes a first amplifier configured to receive a first bit of a data block in the digital serialized data as an input and output a first signal based on a value of the first bit, a first filter circuit configured to filter the first signal, a second amplifier configured to receive a second bit of the data block as an input and output a second signal based on a value of the second bit, a second filter circuit configured to filter the second signal, and an output configured to output an analog signal based on the filtered first and second signals.

In an illustrative embodiment, a DAC includes a plurality of branches. At least one branch includes a driver including an input and an output. The input of the driver is connected to a respective node that receives a signal that represents a respective bit in a data block. The at least one branch includes a filter including an input and an output, with the input of the filter being connected to the output of the driver. The DAC includes an output commonly connected to the plurality of branches and configured to output an analog signal.

Additional features and advantages are described herein and will be apparent from the following description and the figures.

BRIEF DESCRIPTION OF THE DRAWINGS

The present disclosure is described in conjunction with the appended figures, which are not necessarily drawn to scale.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

It will be appreciated from the following description, and for reasons of computational efficiency, that the components of the system can be arranged at any appropriate location within a distributed network of components without impacting the operation of the system.

Furthermore, it should be appreciated that the various links connecting the elements can be wired, traces, or wireless links, or any appropriate combination thereof, or any other appropriate known or later developed element(s) that is capable of supplying and/or communicating data to and from the connected elements. Transmission media used as links, for example, can be any appropriate carrier for electrical signals, including coaxial cables, copper wire and fiber optics, electrical traces on a PCB, or the like.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The terms "determine," "calculate," and "compute," and variations thereof, as used herein, are used interchangeably and include any appropriate type of methodology, process, operation, or technique.

Various aspects of the present disclosure will be described herein with reference to drawings that may be schematic illustrations of idealized configurations.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "including," "includes," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Where reference to general element or set of elements is appropriate instead of a specific element, the description may refer to the element or set of elements by its root term. For example, when reference to a specific filter circuit $CTLE_0$, $CTLE_1$, etc. is not necessary, the description may refer to the filter circuit(s) in general as "CTLE."

Inventive concepts are directed to a distributed analog transmission continuous-time linear equalizer (CTLE) for use in a passive method for transmitter bandwidth extension and size reduction (due to reduced size T-coils). Inventive concepts relate to SerDes transmitters with a voltage driver output stage (e.g., SST, KDM, etc.), in which the output signal is composed of a variety of voltage signals. Each signal is passed through a specific analog CTLE. Unlike existing methods (e.g., TX FFE, common output analog CTLE), inventive concepts do not consume additional power or reduce the output level of the wanted signal.

As SerDes rates rise, the bandwidth requirements of the analog transmitter are getting more challenging. Inventive concepts propose devices and methods for extending the analog bandwidth of a SerDes transmitter. Inventive concepts may be suitable for voltage mode transmitters.

Related art methods for bandwidth extension include using a digital FIR that shapes the digital signal (pre-emphasis), for compensation of the transmitter analog bandwidth limitation. This method consumes power and reduces the effective dynamic range of the DAC. That is, the peak-to-average power ratio (PAPR) of the digital signal is increased due to the pre-emphasis. Another related art method includes using a CTLE that is placed between the DAC output and the ESD+T-coils network. This kind of CTLE acts like an attenuator with spectral shaping with higher attenuation at low frequencies than at high frequencies. Overall, the major drawback of this method is that the wanted signal is attenuated. Still another related art method for bandwidth extension is using the inductors of the T-coils. The inductors of the T-coil are used to compensate the high capacitance of the ESD devices. Since, the T-coil inductors have to insure both input matching of the transmitter and spectral shaping, the combined operation has limited effect on the transmitter bandwidth. Furthermore, these inductors are large devices with a noticeable footprint on the overall transmitter size. Reducing the spectral shaping requirements, leads to a reduction of the size of these inductors.

Inventive concepts overcome the drawbacks of existing methods in that the wanted signal is not attenuated and increased power consumption and component size are avoided.

Figure 1:
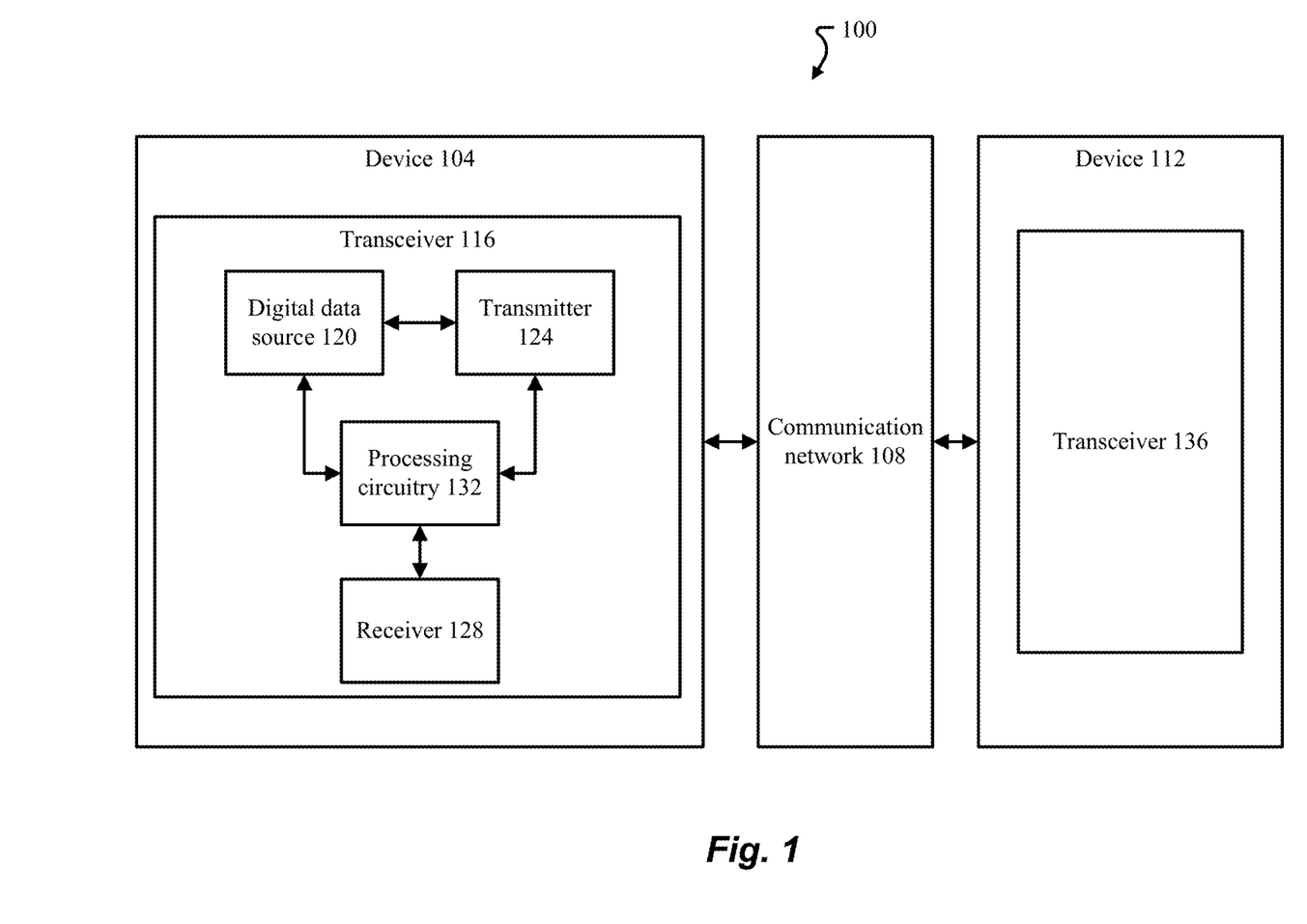
FIG. 1 illustrates a system according to at least one example embodiment.

FIG. 1 illustrates an optical system 100 according to at least one example embodiment. The optical system 100 includes a device 104, a communication network 108, and a device 112. In at least one example embodiment, devices 104 and 112 correspond to one or more of a Personal Computer (PC), a laptop, a tablet, a smartphone, a server, a collection of servers, or the like. In some embodiments, the devices 104 and 112 may correspond to any appropriate type of device that communicates with other devices also connected to a common type of communication network 108. As another specific but non-limiting example, the devices 104 and 112 may correspond to servers offering information resources, services and/or applications to user devices, client devices, or other hosts in the system 100.

Examples of the communication network 108 that may be used to connect the devices 104 and 112 include an Internet Protocol (IP) network, an Ethernet network, an InfiniBand (TB) network, a Fibre Channel network, the Internet, a cellular communication network, a wireless communication network, combinations thereof (e.g., Fibre Channel over Ethernet), variants thereof, and/or the like. In one specific, but non-limiting example, the communication network 108 is a network that enables data transmission between the devices 104 and 112 using optical signals. In this case, the devices 104 and 112 and the communication network 108 may include waveguides (e.g., optical fibers) that carry the optical signals.

The device 104 includes a transceiver 116 for sending and receiving signals, for example, data signals. The data signals may be optical signals modulated with data or other suitable signal for carrying data.

The transceiver 116 may include a digital data source 120, a transmitter 124, a receiver 128, and processing circuitry 132 that controls the transceiver 116. The digital data generator 120 may include suitable hardware and/or software for outputting data in a digital format (e.g., in binary code and/or thermometer code). The digital data output by the digital data source 120 may be retrieved from memory (not illustrated) or generated according to input (e.g., user input).

The transmitter 124 includes suitable software and/or hardware for receiving digital data from the digital data source 120 and outputting data signals according to the digital data for transmission over the communication network 108 to device 112. Additional details of the structure of the transmitter 124 are discussed in more detail below with reference to the figures.

The receiver 128 may include suitable hardware and/or software for receiving signals, for example, data signals from the communication network 108. For example, the receiver 128 may include a photodetector for detecting optical signals and/or a demodulator for demodulating received data signals to extract the data for storing in a memory.

The processing circuitry 132 may comprise software, hardware, or a combination thereof. For example, the processing circuitry 132 may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include Flash memory, Random Access Memory (RAM), Read Only Memory (ROM), variants thereof, combinations thereof, or the like. In some embodiments, the memory and processor may be integrated into a common device (e.g., a microprocessor may include integrated memory). Additionally or alternatively, the processing circuitry 132 may comprise hardware, such as an application specific integrated circuit (ASIC). Other non-limiting examples of the processing circuitry 132 include an Integrated Circuit (IC) chip, a Central Processing Unit (CPU), a General Processing Unit (GPU), a microprocessor, a Field Programmable Gate Array (FPGA), a collection of logic gates or transistors, resistors, capacitors, inductors, diodes, or the like. Some or all of the processing circuitry 132 may be provided on a Printed Circuit Board (PCB) or collection of PCBs. It should be appreciated that any appropriate type of electrical component or collection of electrical components may be suitable for inclusion in the processing circuitry 132. The processing circuitry 132 may send and/or receive signals to and/or from other elements of the transceiver 116 to control overall operation of the transceiver 116.

The transceiver 116 or selected elements of the transceiver 116 may take the form of a pluggable card or controller for the device 104. For example, the transceiver 116 or selected elements of the transceiver 116 may be implemented on a network interface card (NIC).

The device 112 may include a transceiver 136 for sending and receiving signals, for example, data signals over the communication network 108. The same or similar structure of the transceiver 116 may be applied to transceiver 136, and thus, the structure of transceiver 136 is not described separately.

Although not explicitly shown, it should be appreciated that devices 104 and 112 and the transceivers 116 and 120 may include other processing devices, storage devices, and/or communication interfaces generally associated with computing tasks, such as sending and receiving data.

Figure 2:
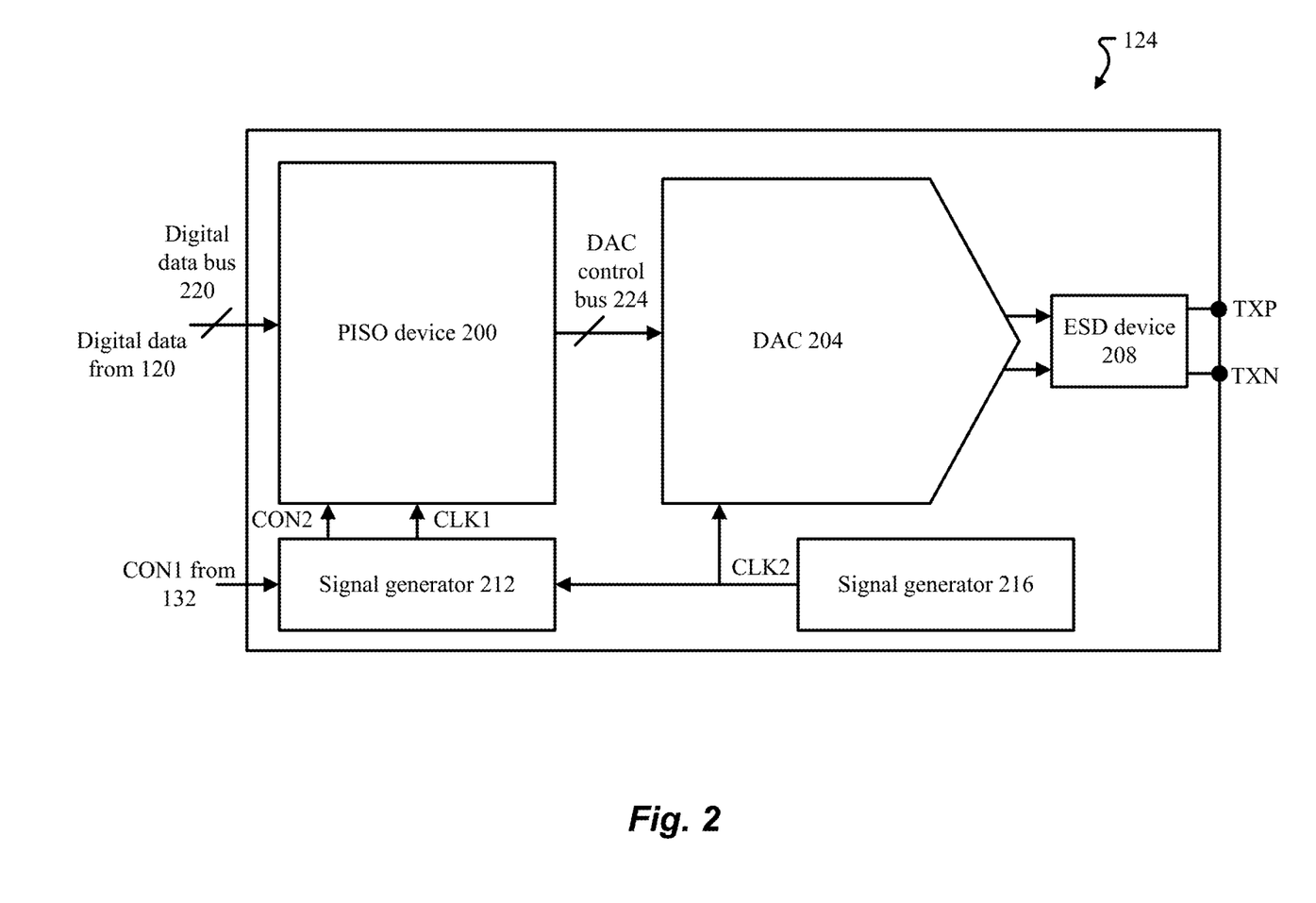
FIG. 2 illustrates additional details of the transmitter in FIG. 1 according to at least one example embodiment.

FIG. 2 illustrates additional details of the transmitter 124 in FIG. 1 according to at least one example embodiment.

The transmitter 124 includes a parallel input serial output (PISO) device 200, a DAC 204, an electrostatic (ESD) device 208, and signal generators 212 and 216. The PISO device 200 includes suitable components for serializing the parallel input data to output serialized data. That is, the PISO device 200 is configured to output digital serialized data based on digital parallel input data. The digital parallel input data may be received by the PISO device 200 over a digital data bus 220 from digital data source 120.

The DAC 204 receives the serialized digital data from the PISO device 200 over a DAC control bus 224. The DAC 204 converts the serialized digital data into an analog signal which corresponds to a data signal for transmission over the communication network 108. The data transmitted over the DAC control bus 224 may include binary encoded data, thermometer encoded data, any other suitably encoded data, or a combination thereof. A data block (e.g., a digital data block) including some bits encoded in binary code and some bits encoded in thermometer code may be useful for reducing mismatch between branches of the DAC 204. Details of the DAC 204 are discussed in more detail below with reference to FIGS. 2-4C.

The ESD device 208 is coupled to the output of the DAC 204 and a node (or nodes) that is configured to be connected to a load (e.g., a transmission line). For example, the ESD device is coupled between the output of the DAC 204 and differential output nodes or pins TXP and TXN. The ESD device 208 may include suitable circuitry for reducing or eliminating electrostatic shock at the differential output nodes or pins TXP and TXN of the transmitter 124. In at least one example embodiment, the ESD device 208 comprises inductors and at least one capacitor in a T-coil configuration. Here, it should be appreciated that example embodiments are not limited to transmitters with differential outputs TXP and TXN, and that the transmitter 124 may have a single-ended output if desired.

The signal generator 212 includes suitable components for receiving control signals CON1 from processing circuitry 132 and generating controls signals CON2 and a clock signal CLK1 for the PISO device 200. The control signals CON2 and/or the clock signal CLK1 may be generated by the signal generator 212 based on control signals CON1. The clock signal CLK1 may control the rate at which the digital data input to the PISO device 200 is serialized. Control signals CON1 and/or CON2 may include set/reset signals, enable/disable signals, frequency setting signals for setting a frequency of CLK1 (e.g., a programmable divider that receives CLK1 and/or CLKQ to generate CLK1), signals to adjust the speed of data received over bus 224, and/or other adjustment signals (e.g., signals to adjust one or more of the clock signals).

The signal generator 216 includes suitable components for generating a second clock signal CLK2 for the DAC 204. In at least one example embodiment, the signal generator 216 includes phase locked loop (PLL) circuitry that generates the second clock signal CLK2 at a desired frequency. The DAC 204 may use the second clock signal CLK2 to control the rate of digital-to-analog conversion.

The frequencies of clock signals CLK1 and CLK2 are a design parameter set based on empirical evidence and/or preference. For example, the frequencies of the clock signals CLK1 and/or CLK2 may be set based on a speed at which digital data is received from digital data source 120 and/or based on a speed at which the data is desired to be transmitted from the transmitter 124. In at least one example embodiment, the frequency of the first clock signal CLK1 is less than the frequency of the second clock signal CLK2. The signal generator 212 may receive the clock signal CLK2 and use the clock signal CLK2 to adjust a frequency of the clock signal CLK1 so that the PISO device 200 and the DAC 204 are properly synchronized.

Figure 3A:
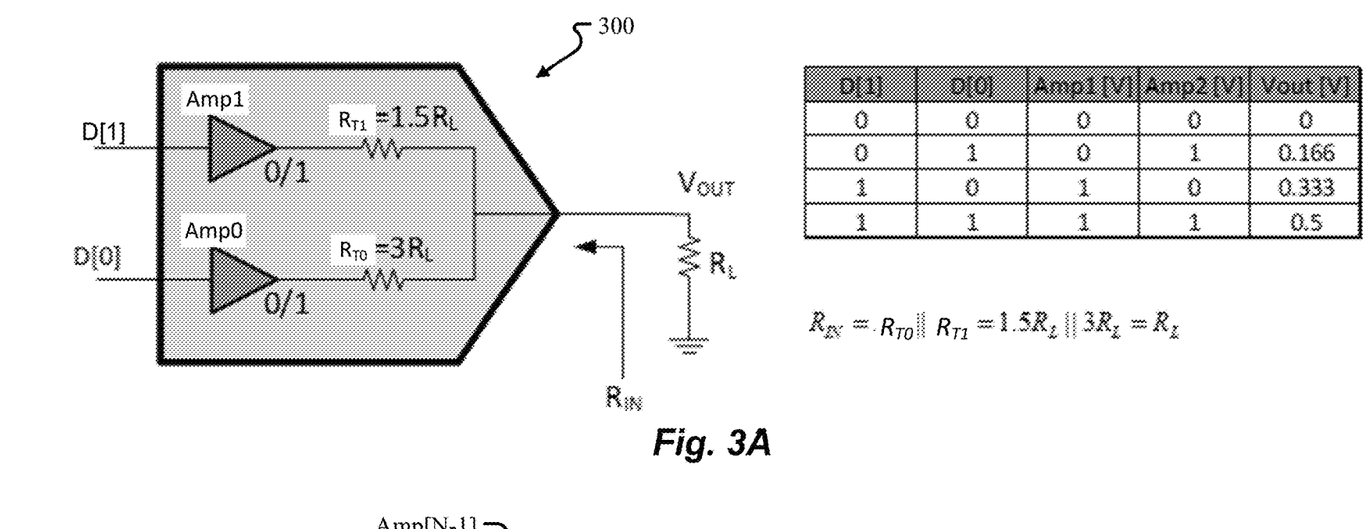
FIGS. 3A and 3B illustrate general schematic views for a two-bit DAC and an N-bit DAC according to at least one example embodiment.
Figure 3B:
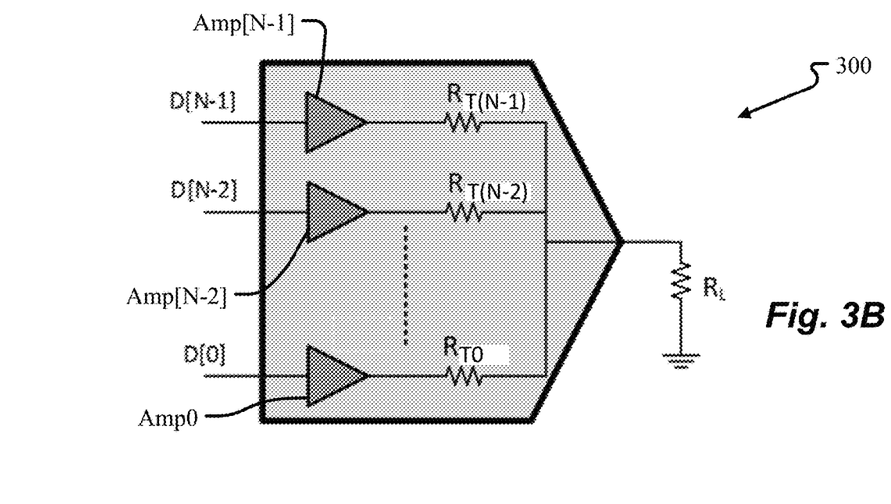

FIGS. 3A and 3B illustrate general schematic views for a two-bit DAC and an N-bit DAC according to at least one example embodiment. Here, it should be appreciated that FIGS. 3A and 3B illustrate examples of a DAC in a source-series termination (SST) voltage driver configuration. FIG. 3A illustrates a two-bit SST DAC while FIG. 3B illustrates an N-bit SST DAC. FIGS. 3A and 3B illustrates DACs with single-ended outputs, but it should be appreciated that the DACs 300 may alternatively include differential output, in which case the structure is modified to output a differential signal.

As illustrated in FIG. 3A, the DAC 300 includes amplifiers (or drivers) Amp0 and Amp1 that receive two bits of digital input data D[0] and D[1], where D[0] is a least significant bit (LSB) of a data block D and D[1] is a most significant bit (MSB) of the same data block D. In FIG. 3A, the amplifiers may compare the value of an input bit against a threshold (e.g., a threshold voltage value of a reference signal) and output a signal based on the comparison. In this case, an input bit with a binary value of 0 may cause an amplifier Amp to have an analog output of 0V while an input bit with a binary value of 1 may cause an amplifier Amp to have an analog output of 1V. The DAC 300 further includes resistors RT0 and RT1 that, in combination with load resistance $R_L$, function as a voltage divider so that an output voltage Vout of the DAC 300 is based on the outputs of the amplifiers Amp0 and Amp1. FIG. 3A illustrates an example table where the various combinations of possible input data result in an output voltage of 0V, 0.166V, 0.333V, and 0.5V, however example embodiments are not limited to these values and any suitable voltage range may be used.

FIGS. 3A and 3B illustrate amplifiers Amp for the purpose of receiving an input bit and outputting a voltage based on the input bit. However, other suitable drivers with amplification capabilities may be used.

FIG. 3A further illustrates how values of the resistors $R_{T0}$ and $R_{T1}$ are weighted. In the example of FIG. 3A, a value of $R_{T0}$ is equal to 1.5 $R_L$ while a value of $R_{T1}$ is equal to 3 $R_L$. Weighting the resistors $R_{T0}$ and $R_{T1}$ in this fashion allows for each branch of the DAC 300 to have a different effect on the final analog signal output from the DAC 300, thereby ensuring that the analog signal has a voltage that corresponds to the sequence of bits in the data block D input to the DAC 300. In FIG. 3A, the data block D may be defined by the sequence of bits formed by data D[0] and D[1] (e.g., the data block is 00, 01, 10, or 11 for the two-bit DAC of FIG. 3A). From the perspective of the load $R_L$, RIN may be an impedance of the DAC 300, which may be set to about 50 ohms in at least one example.

Although not explicitly shown, it should be appreciated that the gains of amplifiers Amp0 and Amp1 may be different. For example, a gain of Amp1 may be about twice a gain of Amp0.

FIG. 3B illustrates an N-bit DAC 300, where N represents a number of bits in the data block D being converted to an analog signal. For example, if the DAC 300 is a 3-bit DAC, then the data block D is a 3-bit sequence of bits having one of eight possible combinations of bits: 000, 001, 010, 011, 100, 101, 110, or 111. Data D[N−1] may be an MSB bit of the data block D, data D[N−2] may be a next MSB bit of the data block D, and so on until reaching data D[0] as an LSB of the data block D. As in FIG. 3A, each amplifier Amp[N−1], Amp[N−2] Amp0 may have a different gain. For example, an amplifier Amp0 that receives data bit D[0] may have a baseline gain x while each amplifier receiving more significant bits of data D has a gain that is a multiple of x. The gain for each amplifier may be weighted according to a consistent multiple of x (e.g., the gain for each amplifier doubles compared to a previous amplifier moving from Amp0 to Amp[N−1]). In FIG. 3B, for example, the amplifier Amp[N−1] has a gain that is double the gain for amplifier Amp[N−2]. Throughout the instant description, it should be appreciated that the [N−1], [N−2], etc. notation used to refer to certain elements assumes that the first element in the grouping of elements is a $0^{th}$ element, where N is a number bits in a data block D and/or a number of bits input to a DAC. For example, the LSB of a data block D is a $0^{th}$ bit and the MSB of the data block D is the $(N-1)^{th}$ bit. Therefore, the LSB in of an N-bit data block D is referred to as D[0] and the MSB in the N-bit data block D is referred to as D[N−1] (where N is a number of bits in the data block D). The same notation is true other depicted elements, such as amplifiers Amp and filter circuits CTLE, where N is a number bits in a data block D and/or a number of bits input to a DAC.

Figures 4A, 4B, 4C:
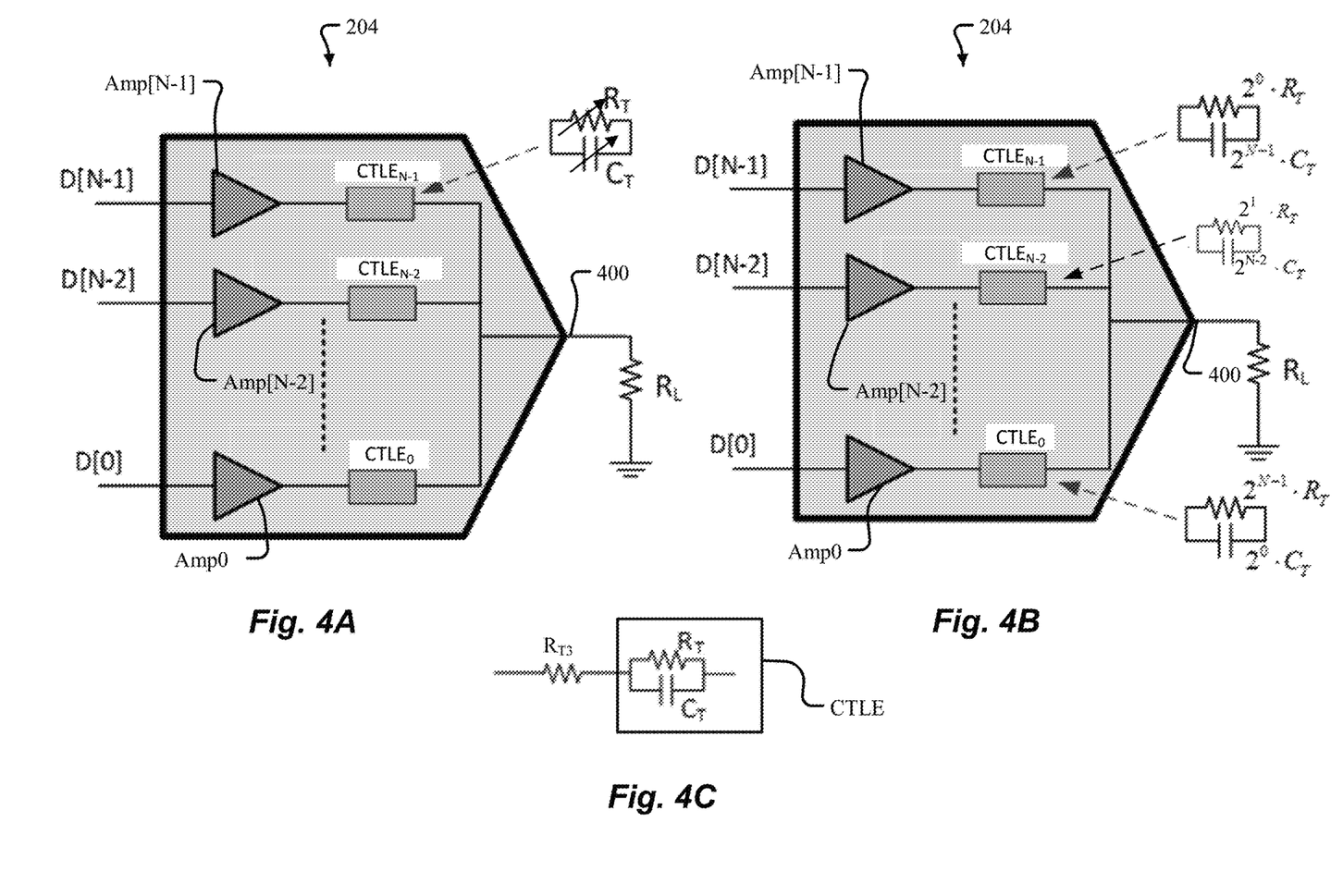
FIGS. 4A to 4C illustrate example schematics for the DAC from FIG. 2 that incorporates similar weighting concepts from the DACs in FIGS. 3A and 3B according to at least one example embodiment.

FIGS. 4A to 4C illustrate example schematics for the DAC 204 from FIG. 2 that incorporates similar weighting concepts from the DAC 300 in FIGS. 3A and 3B according to at least one example embodiment. Compared to FIGS. 3A and 3B, FIGS. 4A and 4B illustrate N-bit DACs 204 that operate in the same or similar fashion as the DAC 300, except that FIGS. 4A and 4B further illustrate filter circuits (e.g., passive filters) CTLEs for each branch of the DAC 204 that passively filter signals output from amplifiers Amp. The output of the DAC 204 may be an analog signal having an amplitude that corresponds to the sequence of bits input to the DAC 204 as a data block D. In addition, the quality of the analog signal output from the DAC 204 is characterized by a number of parameters that include signal-to-noise+distortion ratio (SNDR), jitter, bandwidth, and/or the like. The CTLEs illustrated in FIGS. 4A to 4C are passive filters, however, example embodiments are not limited thereto and active filters may additionally or alternatively be employed. An active filter may include an amplifier arranged in a configuration with one or more resistors or capacitors to actively filter received signals. In addition, FIGS. 4A to 4C illustrate a DAC 204 with a single-ended output, but it should be appreciated that the DAC 204 may alternatively include differential output as in FIG. 2, in which case the structure is modified in accordance with the knowledge of one of ordinary skill in the art to process and output differential signals.

As shown in FIG. 4A, the DAC 204 includes a plurality of branches with each branch including an amplifier (or driver) Amp and a filter circuit CTLE. The amplifiers Amp0 to Amp[N−1] may have gains weighted in the same manner as that described above with reference to FIGS. 3A and 3B. That is, amplifier Amp0 may have a base gain value of x that receives a LSB D[0] of a data block D while remaining amplifiers Amp in the DAC 204 have gains that are a multiple of x depending upon the significance of the bit received (e.g., the gain for each amplifier doubles compared to a previous amplifier moving from Amp0 to Amp[N−1]). For example, a gain of Amp[N−1] is double the gain of Amp[N−2]. The base gain value and multiplier may be design parameters set based on empirical evidence and/or preference.

FIG. 4A further illustrates the inclusion of filter circuits $CTLE_0$ to $CTLE_{N-1}$. The filter circuits may be continuous-time linear equalizers (CTLEs). In general, each filter circuit $CTLE_0$ to $CTLE_{N-1}$ may include a resistance $R_T$ in parallel with a capacitance $C_T$ to passively filter each signal output from a respective amplifier Amp. In at least one example embodiment, the resistor $R_T$ and/or the capacitance $C_T$ are variable. For example, the DAC includes circuitry configured to adjust values of $R_T$ and $C_T$. Such circuitry may include one or more other resistors that can be disconnected or connected to $R_T$ (in series or in parallel) to adjust the value of $R_T$. The circuitry may further include one or more other capacitors that can be disconnected or connected to $C_T$ (in series or in parallel) to adjust the value of $C_T$. The connection and disconnection of other resistors and/or capacitors may be accomplished with a network of switches, and the same concept may apply to the resistances and capacitances in FIG. 4B. The filter circuits $CTLE_0$ to $CTLE_{N-1}$ have outputs that are commonly connected an output 400 of the DAC 204.

FIG. 4B illustrates how values of the resistor and capacitor of each filter circuit CTLE are weighted in accordance with similar weighting concepts described above with reference to FIGS. 3A and 3B. For example, for a given base resistance value $R_T$ and a given base capacitance value $C_T$, then each filter circuit CTLE of the DAC 204 has resistance and capacitance values that adhere to the weighting shown in FIG. 4B. For example, filter circuit $CTLE_{N-1}$ has a resistor with a value of $2^0 \times R_T$ and a capacitor with a value of $2^{N-1} \times C_T$, filter circuit $CTLE_{N-2}$ has a resistor with value of $2^1 \times R_T$ and a capacitor with a value of $2^2 \times C_T$, filter circuit $CTLE_{N-3}$ (not shown) that receives data D[N−3] has a resistor with a value of $2^2 \times R_T$ and a capacitor with a value of $2^{N-3} \times C_T$, and so on until filter circuit $CTLE_0$, which has a resistor with a value of $2^{N-1} \times R_T$ and a capacitor with a value $2^0 \times C_T$ (recalling that N represents a number of bits of a data block D being converted by the DAC 204 to an analog signal). In other words, a resistance value of the resistor and a capacitance value of the capacitor for each filter circuit CTLE are inversely proportional, which is useful for ensuring that frequency responses of all of the filter circuits CTLEs are substantially the same. For example, each filter circuit CTLE functions as a high-pass filter to pass substantially the same band of frequencies.

Providing a filter circuit CTLE for each branch of the DAC 204 enables a frequency shaping capability for each branch so that at low frequencies, each branch has a same gain as a typical DAC, while at high frequencies, each branch has more gain. That is, at low frequencies, the capacitor in each filter circuit CTLE may have little or no effect on the signal input from an amplifier, but at higher frequencies, the capacitor in each filter circuit CTLE has an effect on the signal input from an amplifier in that more energy is passed through the capacitor. The inclusion of a filter circuit CTLE for at least one branch of the DAC 204 may increase the bandwidth of the transmitter 124 while avoiding attenuation of the output signal of the DAC 204 and avoiding increased power consumption and component size.

In some cases, the value for the capacitor in a particular filter circuit CTLE may be so small that the capacitor can be omitted from the filter circuit CTLE so that the particular filter circuit CTLE includes only a resistor. In general, branches of the DAC 204 that may omit the capacitor from a respective filter circuit CTLE are branches that receive a least significant bit or lesser significant bits of the data block D. For example, the capacitor may be omitted from the filter circuit $CTLE_0$ for the branch that receives the LSB (i.e., D[0]) of the data block D. However, example embodiments are not limited thereto, and other branches may also omit the capacitor in a respective filter circuit CTLE if desired.

Although not explicitly shown in FIGS. 4A and 4B, it should be appreciated that the ESD device 208 from FIG. 2 exists between $R_L$ and the output 400 of the DAC 204. In addition, other unillustrated elements generally known to be useful for digital-to-analog conversion may be included in the DAC 204.

FIG. 4C illustrates an example of a modification for at least one branch of the DAC 204 in FIGS. 4A and 4B according to at least one example embodiment. As shown in FIG. 4C, a resistor RT3 may be added between an amplifier output of a branch and the filter circuit CTLE including resistor $R_T$ and capacitor $C_T$ in FIGS. 4A and 4B. A value of resistor RT3 may be variable in the same manner as that described for resistor $R_T$ in FIG. 4A. Further, the value of resistor RT3 may vary for each branch of the DAC 204 and be a design parameter set based on empirical evidence and/or preference. Including RT3 as part of at least one filter circuit CTLE (or all filter circuits) in FIGS. 4A and 4B may improve overall output impedance matching of the DAC 204 with the load $R_L$. Additionally or alternatively, improved impedance matching may also be accomplished by adjusting T-coils of the ESD device 208 to compensate for the output impedance of the DAC 204 and/or by designing the output impedance of each amplifier Amp to be part of the output impedance of the DAC 204.

In view of FIGS. 1 to 4C, at least one example embodiment is directed to a DAC 204 including a first amplifier (e.g., Amp[N−2]) configured to receive a first bit D[N−2] of a data block D as an input and output a first signal based on a value (e.g., a binary value) of the first bit D[N−2] of the data block D. The DAC 204 includes a first filter circuit $CTLE_{N-2}$ configured to filter the first signal. The DAC 204 includes an output 400 configured to output an analog signal based on a combination of the filtered first signal and a second signal that represents a value (e.g., a binary value) of a second bit (e.g., D[N−1] of the data block D). The analog signal output by the DAC 204 corresponds to the sequence of bits of the data block D. For example, an amplitude of the analog signal corresponds to the sequence of bits in the data block D (see FIG. 3A where an analog signal Vout with an amplitude of 0.5V corresponds binary sequence '11' of data block D).

The DAC 204 further includes a second amplifier Amp [N−1] configured to receive the second bit D[N−1] of the data block D as an input and output the second signal based on the value of the second bit D[N−1] of the data block D. The DAC 204 further includes a second filter circuit $CTLE_{N-1}$ configured to filter the second signal. The output 400 of the DAC 204 is configured to output the analog signal based on the filtered first signal and the filtered second signal. For example, the output of the DAC 204 is a voltage that is a product of voltage division from the filter circuits CTLE and the load resistance $R_L$. As shown in FIGS. 4A and 4B, the first filter circuit $CTLE_{N-2}$ includes a first resistance and a first capacitance, and the second filter circuit $CTLE_{N-1}$ includes a second resistance and a second capacitance. The first bit D[N−2] is a less significant bit of the data block D than the second bit D[N−1], and a first value of the first resistance (e.g., $2^1 \times R_T$) is greater than a second value of the second resistance (e.g., $2^0 \times R_T$). On the other hand, a first value of the first capacitance (e.g., $2^{N-2} \times C_T$) is less than a second value of the second capacitance (e.g., $2^{N-1} \times C_T$). In addition, the first resistance and the first capacitance are connected in parallel, and the second resistance and the second capacitance are connected in parallel. Values of the first and second resistances and values of the first and second capacitances are selected such that the first and second filter circuits $CTLE_{N-1}$ and $CTLE_{N-2}$ have a substantially same frequency response for the filtered first and second signals.

As further described above, a gain of the second amplifier Amp[N−1] is greater than a gain of the first amplifier Amp[N−2]. For example, the gain of the second amplifier Amp N−1 is at least twice the gain of the first amplifier Amp[N−1].

As illustrated in FIG. 4C, each filter circuit or select filter circuits CTLE may further include a series resistor connected between an amplifier Amp and a filter circuit CTLE. For example, a third resistance RT3 is connected between an output of the first amplifier Amp[N−2] and the first filter circuit $CTLE_{N-2}$, and a fourth resistance (another RT3) is connected between an output of the second amplifier Amp [N−1] and the second filter circuit $CTLE_{N-1}$.

According to at least one example embodiment, the DAC 204 includes circuitry configured to adjust values of at least one of the second resistance or the second capacitance.

In view of FIGS. 1-4C, at least one example embodiment is directed to a transmitter 124 including a parallel input serial output (PISO) device 200 configured to output digital serialized data based on digital parallel input data. The transmitter 124 includes a DAC 204 including a first amplifier Amp[N−2] configured to receive a first bit D[N−2] of a data block D in the digital serialized data as an input and output a first signal based on a value (e.g., a binary value) of the first bit D[N−2]. The DAC 204 includes a first filter circuit $CTLE_{N-2}$ configured to filter the first signal, a second amplifier Amp[N−1] configured to receive a second bit D[N−1] of the data block D as an input and output a second signal based on a value (e.g., a binary value) of the second bit D[N−1], a second filter circuit $CTLE_{N-1}$ configured to filter the second signal, and an output 400 configured to output an analog signal based on the filtered first and second signals. The analog signal may have an amplitude that is indicative of the sequence of bits in the data block D. As noted above, the first filter circuit $CTLE_{N-2}$ includes a first filter, and the second filter circuit $CTLE_{N-1}$ includes a second filter. The transmitter further includes a first signal generator 212 configured to generate a first clock signal CLK1 for the PISO device 200, and a second signal generator 216 configured to generate a second clock signal CLK2 for the DAC 204. A frequency of the first clock signal CLK2 may be less than a frequency of the second clock signal CLK2.

The transmitter 124 may further include an electrostatic discharge device 208 coupled to the output 400 of the DAC 204 and a node TXP and/or TXN that is configured to be connected to a load.

In view of FIGS. 1-4C, at least one example embodiment is directed to a DAC 204 including a plurality of branches. At least one branch includes a driver (e.g., an amplifier)

including an input and an output. As shown in FIGS. 4A to 4C, the input of the driver is connected to a respective node that receives a signal that represents a respective bit in a data block D. The at least one branch includes a filter CTLE including an input and an output, where the input of the filter CTLE is connected to the output of the driver. The DAC 204 further includes an output 400 commonly connected to the plurality of branches and configured to output an analog signal that corresponds to a sequence of bits in the data block D. For the at least one branch, the filter CTLE includes a first resistance $R_T$ connected in parallel with a capacitance $C_T$.

The at least one branch may further comprise a second resistance RT3 connected between the output of the driver and the input of the filter CTLE. In at least one example embodiment, the driver includes an amplifier, and the amplifier for each branch in the plurality of branches has a different gain.

In view of the foregoing, it should be appreciated that inventive concepts relate to, among other things, including filter circuits (e.g., passive filter circuits) in each branch of a DAC in a transmitter, which may improve the bandwidth of the transmitter without attenuating the signal and without increasing component size and/or power consumption. Inventive concepts may also provide for improved impedance matching for the DAC. Further, inventive concepts may be useful applications such as 200G SerDes transmitters.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

It should be appreciated that inventive concepts cover any embodiment in combination with any one or more other embodiment, any one or more of the features disclosed herein, any one or more of the features as substantially disclosed herein, any one or more of the features as substantially disclosed herein in combination with any one or more other features as substantially disclosed herein, any one of the aspects/features/embodiments in combination with any one or more other aspects/features/embodiments, use of any one or more of the embodiments or features as disclosed herein. It is to be appreciated that any feature described herein can be claimed in combination with any other feature(s) as described herein, regardless of whether the features come from the same described embodiment.

Example embodiments may be configured according to the following:

(1) A digital to analog converter (DAC), comprising:
　a first amplifier configured to receive a first bit of a data block as an input and output a first signal based on a value of the first bit of the data block;
　a first filter circuit configured to filter the first signal; and
　an output configured to output an analog signal based on a combination of the filtered first signal and a second signal that represents a value of a second bit of the data block.

(2) The DAC of (1), further comprising:
　a second amplifier configured to receive the second bit of the data block as an input and output the second signal based on the value of the second bit of the data block; and
　a second filter circuit configured to filter the second signal, wherein the output is configured to output the analog signal based on the filtered first signal and the filtered second signal.

(3) The DAC of one or more of (1) to (2), wherein the first filter circuit includes a first resistance and a first capacitance, wherein the second filter circuit includes a second resistance and a second capacitance, and wherein the first filter circuit is configured to passively filter the first signal and the second filter circuit is configured to passively filter the second signal.

(4) The DAC of one or more of (1) to (3), wherein the first bit is a less significant bit of the data block than the second bit, wherein a first value of the first resistance is greater than a second value of the second resistance.

(5) The DAC of one or more of (1) to (4), wherein a first value of the first capacitance is less than a second value of the second capacitance.

(6) The DAC of one or more of (1) to (5), wherein a gain of the second amplifier is greater than a gain of the first amplifier.

(7) The DAC of one or more of (1) to (6), wherein the gain of the second amplifier is at least twice the gain of the first amplifier.

(8) The DAC of one or more of (1) to (7), wherein the first resistance and the first capacitance are connected in parallel, and wherein the second resistance and the second capacitance are connected in parallel.

(9) The DAC of one or more of (1) to (8), further comprising:
　a third resistance connected between an output of the first amplifier and the first filter circuit; and
　a fourth resistance connected between an output of the second amplifier and the second filter circuit.

(10) The DAC of one or more of (1) to (9), wherein values of the first and second resistances and values of the first and second capacitance are selected such that the first and second filter circuits have a substantially same frequency response for the filtered first and second signals.

(11) The DAC of one or more of (1) to (10), further comprising:
　circuitry configured to adjust values of at least one of the second resistance or the second capacitance.

(12) A transmitter, comprising:
　a parallel input serial output (PISO) device configured to output digital serialized data based on digital parallel input data; and
　a digital to analog (DAC) converter including:
　　a first amplifier configured to receive a first bit of a data block in the digital serialized data as an input and output a first signal based on a value of the first bit;
　　a first filter circuit configured to filter the first signal;
　　a second amplifier configured to receive a second bit of the data block as an input and output a second signal based on a value of the second bit;
　　a second filter circuit configured to filter the second signal; and
　　an output configured to output an analog signal based on the filtered first and second signals.

(13) The transmitter of (12), wherein the first filter circuit includes a first passive filter, and the second filter circuit includes a second passive filter.

(14) The transmitter of one or more of (12) to (13), further comprising:
a first signal generator configured to generate a first clock signal for the PISO device; and
a second signal generator configured to generate a second clock signal for the DAC.

(15) The transmitter of one or more of (12) to (14), wherein a frequency of the first clock signal is less than a frequency of the second clock signal.

(16) The transmitter of one or more of (12) to (15), further comprising:
an electrostatic discharge device coupled to the output of the DAC and a node that is configured to be connected to a load.

(17) A digital to analog converter (DAC), comprising:
a plurality of branches, at least one branch including:
a driver including an input and an output, the input of the driver being connected to a respective node that receives a signal that represents a respective bit in a data block;
a filter including an input and an output, the input of the filter being connected to the output of the driver; and
an output commonly connected to the plurality of branches and configured to output an analog signal.

(18) The DAC of (17), wherein, for the at least one branch, the filter includes a first resistance connected in parallel with a capacitance.

(19) The DAC of one or more of (17) to (18), wherein the at least one branch further comprises:
a second resistance connected between the output of the driver and the input of the filter.

(20) The DAC of one or more of (17) to (19), wherein the driver includes an amplifier, and wherein the amplifier for each branch in the plurality of branches has a different gain.

What is claimed is:

1. A digital to analog converter (DAC), comprising:
a first amplifier that receives a first bit of a data block as an input and output a first signal based on a value of the first bit of the data block;
a first filter circuit that filters the first signal, the first filter circuit including a first capacitance;
an output that outputs an analog signal based on a combination of the filtered first signal and a second signal that represents a value of a second bit of the data block; and
a second filter circuit that filters the second signal, the second filter circuit including a second capacitance separate from the first capacitance, wherein the output outputs the analog signal based on the filtered first signal and the filtered second signal.

2. The DAC of claim 1, further comprising:
a second amplifier that receives the second bit of the data block as an input and output the second signal to the second filter circuit based on the value of the second bit of the data block.

3. The DAC of claim 2, wherein the first filter circuit further includes a first resistance, wherein the second filter circuit further includes a second resistance, and wherein the first filter circuit passively filters the first signal and the second filter circuit passively filters the second signal.

4. The DAC of claim 3, wherein the first bit is a less significant bit of the data block than the second bit, and wherein a first value of the first resistance is greater than a second value of the second resistance.

5. The DAC of claim 4, wherein a first value of the first capacitance is less than a second value of the second capacitance.

6. The DAC of claim 5, wherein a gain of the second amplifier is greater than a gain of the first amplifier.

7. The DAC of claim 6, wherein the gain of the second amplifier is at least twice the gain of the first amplifier.

8. The DAC of claim 7, wherein the first resistance and the first capacitance are connected in parallel, and wherein the second resistance and the second capacitance are connected in parallel.

9. The DAC of claim 3, further comprising:
a third resistance connected between an output of the first amplifier and the first filter circuit; and
a fourth resistance connected between an output of the second amplifier and the second filter circuit.

10. The DAC of claim 3, wherein values of the first and second resistances and values of the first and second capacitances are selected such that the first and second filter circuits have a substantially same frequency response for the filtered first and second signals.

11. The DAC of claim 3, further comprising:
circuitry that adjusts values of at least one of the second resistance or the second capacitance.

12. A transmitter, comprising:
a parallel input serial output (PISO) device that outputs digital serialized data based on digital parallel input data; and
a digital to analog (DAC) converter including:
a first amplifier that receives a first bit of a data block in the digital serialized data as an input and output a first signal based on a value of the first bit;
a first filter circuit that filters the first signal, the first filter circuit including a first capacitance;
a second amplifier that receives a second bit of the data block as an input and output a second signal based on a value of the second bit;
a second filter circuit that filters the second signal, the second filter circuit including a second capacitance separate from the first capacitance; and
an output that outputs an analog signal based on the filtered first and second signals.

13. The transmitter of claim 12, wherein the first filter circuit includes a first passive filter including the first capacitance, and the second filter circuit includes a second passive filter including the second capacitance.

14. The transmitter of claim 12, further comprising:
a first signal generator that generates a first clock signal for the PISO device; and
a second signal generator that generates a second clock signal for the DAC.

15. The transmitter of claim 14, wherein a frequency of the first clock signal is less than a frequency of the second clock signal.

16. The transmitter of claim 12, further comprising:
an electrostatic discharge device coupled to the output of the DAC and a node that connects to a load.

17. A digital to analog converter (DAC), comprising:
a plurality of branches, at least one branch including:
a driver including an input and an output, the input of the driver being connected to a respective node that receives a signal that represents a respective bit in a data block;
a filter including an input and an output, the input of the filter being connected to the output of the driver; and
an output commonly connected to the plurality of branches and that outputs an analog signal, wherein, for the at least one branch, the filter includes a first resistance connected in parallel with a capacitance.

18. The DAC of claim 17, wherein a number of the plurality of branches is based on a number of bits in the data block.

19. The DAC of claim 17, wherein the at least one branch further comprises:
   a second resistance connected between the output of the driver and the input of the filter.

20. The DAC of claim 17, wherein the driver includes an amplifier, and wherein the amplifier for each branch in the plurality of branches has a different gain.

* * * * *